(12) United States Patent
Kopp et al.

(10) Patent No.: US 11,276,788 B2
(45) Date of Patent: Mar. 15, 2022

(54) OPTOELECTRONIC SEMICONDUCTOR CHIP AND METHOD FOR PRODUCING AN OPTOELECTRONIC SEMICONDUCTOR CHIP

(71) Applicant: Osram OLED GmbH, Regensburg (DE)

(72) Inventors: Fabian Kopp, Penang (MY); Attila Molnar, Penang (MY)

(73) Assignee: OSRAM OLED GMBH, Regensburg (DE)

( * ) Notice: Subject to any disclaimer, the term of this patent is extended or adjusted under 35 U.S.C. 154(b) by 110 days.

(21) Appl. No.: 16/635,575

(22) PCT Filed: Jul. 20, 2018

(86) PCT No.: PCT/EP2018/069724
§ 371 (c)(1),
(2) Date: Jan. 31, 2020

(87) PCT Pub. No.: WO2019/025206
PCT Pub. Date: Feb. 7, 2019

(65) Prior Publication Data
US 2020/0220032 A1      Jul. 9, 2020

(30) Foreign Application Priority Data
Aug. 3, 2017   (DE) .................... 10 2017 117 645.4

(51) Int. Cl.
*H01L 31/0224*      (2006.01)
*H01L 31/0232*      (2014.01)
(Continued)

(52) U.S. Cl.
CPC .... *H01L 31/0224* (2013.01); *H01L 31/02327* (2013.01); *H01L 31/18* (2013.01);
(Continued)

(58) Field of Classification Search
CPC ........... H01L 31/0224; H01L 31/02327; H01L 31/18; H01L 1133/382; H01L 31/46;
(Continued)

(56) References Cited

U.S. PATENT DOCUMENTS

2004/0130002 A1*  7/2004  Weeks ................ H01L 31/1848
                                                                  257/622
2007/0176188 A1    8/2007  Tanaka et al.
(Continued)

FOREIGN PATENT DOCUMENTS

DE    102009023849 A1    12/2010
DE    102014114674 A1     4/2016
DE    102015107577 A1    11/2016

OTHER PUBLICATIONS

German search report issued for the corresponding DE application No. 10 2017 117 645.4, dated Apr. 24, 2018, 8 pages (for informational purposes only).
(Continued)

*Primary Examiner* — Sitaramarao S Yechuri
(74) *Attorney, Agent, or Firm* — Viering, Jentschura & Partner Mbb (57) ABSTRACT

An optoelectronic semiconductor chip may include a semiconductor layer sequence provided for generating and/or receiving radiation. The chip may further include a first trench structure and a second trench structure formed in the semiconductor layer sequence. A first contact finger structure may electrically conductively connect the second trench structure to a first semiconductor layer of the semiconductor layer sequence. The first contact finger structure may adjoin a first side surface and/or a second side surface of the second trench structure at least in places. A second contact finger structure may electrically conductively connect to a second semiconductor layer of the semiconductor layer sequence
(Continued)

where the second contact finger may be arranged in the first trench structure.

17 Claims, 6 Drawing Sheets

(51) Int. Cl.
*H01L 31/18* (2006.01)
*H01L 33/38* (2010.01)
*H01L 33/46* (2010.01)

(52) U.S. Cl.
CPC ............ *H01L 33/382* (2013.01); *H01L 33/46* (2013.01); *H01L 2933/0016* (2013.01)

(58) Field of Classification Search
CPC ... H01L 2933/0016; H01L 2224/04042; H01L 2224/05548; H01L 2224/05555
See application file for complete search history.

(56) References Cited

U.S. PATENT DOCUMENTS

| | | | |
|---|---|---|---|
| 2012/0049234 A1* | 3/2012 | Cheng | H01L 33/38 |
| | | | 257/99 |
| 2012/0085988 A1 | 4/2012 | Yu et al. | |
| 2012/0168809 A1 | 7/2012 | Maute et al. | |
| 2014/0131759 A1 | 5/2014 | Kim et al. | |
| 2017/0040494 A1* | 2/2017 | Gim | H01L 33/382 |
| 2017/0040515 A1* | 2/2017 | Lee | H01L 33/382 |
| 2018/0108811 A1 | 4/2018 | Kopp et al. | |

OTHER PUBLICATIONS

International search report issued for the corresponding PCT application No. PCT/EP2018/069724, dated Oct. 4, 2018, 5 pages (2 pages english translation + 3 pages) (for informational purposes only).

\* cited by examiner

OPTOELECTRONIC SEMICONDUCTOR CHIP AND METHOD FOR PRODUCING AN OPTOELECTRONIC SEMICONDUCTOR CHIP

CROSS-REFERENCE TO RELATED APPLICATIONS

The present application is a national stage entry according to 35 U.S.C. § 371 of PCT application No.: PCT/EP2018/069724 filed on Jul. 20, 2018; which claims priority to German Patent Application Serial No.: 10 2017 117 645.4, which was filed on Aug. 3, 2017; which is incorporated herein by reference in its entirety and for all purposes.

TECHNICAL FIELD

The present application relates to an optoelectronic semiconductor chip and to a method for producing an optoelectronic semiconductor chip.

BACKGROUND

Optoelectronic semiconductor components, for example light-emitting diodes, often include contact structures for laterally uniform current introduction. However, these typically metallic contact structures significantly reduce the brightness of the emitted radiation because of radiation absorption.

SUMMARY

It is an object to provide an optoelectronic semiconductor chip in which absorption losses are minimized and the efficiency is increased. A further intention is to provide a method with which an optoelectronic semiconductor chip can be produced in a straightforward and reliable way.

An optoelectronic semiconductor chip is provided.

According to at least one embodiment of the optoelectronic semiconductor chip, the optoelectronic semiconductor chip includes a semiconductor layer sequence having a first semiconductor layer, a second semiconductor layer and an active region, which is arranged between the first semiconductor layer and the second semiconductor layer. The active region is provided for generating and/or receiving radiation. The radiation lies, for example, in the ultraviolet, visible or infrared spectral range.

The first semiconductor layer and the second semiconductor layer are different to one another at least in places in respect of their conduction type, so that the active region is located in a pn junction. For example, the first semiconductor layer is n-conductive and the second semiconductor layer is p-conductive, or vice versa.

The semiconductor layer sequence is for example arranged on a substrate, in particular a growth substrate for epitaxial deposition of the semiconductor layer sequence. The first semiconductor layer is, for example, arranged between the substrate and the active region.

According to at least one embodiment of the optoelectronic semiconductor chip, a first trench structure is formed in the semiconductor layer sequence. The first trench structure passes, in particular, through the second semiconductor layer and the active region. In the lateral direction, i.e. in a direction extending along a main extent plane of the active region, the trench structure is bounded by a first side surface and a second side surface. The first trench structure is thus located along the lateral direction between the first side surface and the second side surface. The first side surface and the second side surface respectively adjoin the active region and bound it at least in places in the lateral direction.

Between the first side surface and the second side surface of the first trench structure, the active region is removed fully or at least in places. A subregion of the active region, optionally remaining between the first side surface and the second side surface of the first trench structure, is not provided for generating or detecting radiation. For example, this subregion is electrically deactivated. Thus, during operation of the region of the semiconductor chip, for at least one charge carrier type, i.e. electrons or holes, no charge carrier injection into this subregion takes place.

In the vertical direction, i.e. perpendicularly to the main extent plane of the active region, the first trench structure is in particular at least so deep that the first semiconductor layer is exposed in the first trench structure at least in places. A bottom surface of the first trench structure is thus formed at least in places by the first semiconductor layer. In other words, the bottom surface of the first trench structure is arranged at a shorter distance from the substrate than the active region is.

According to at least one embodiment of the optoelectronic semiconductor chip a second trench structure is formed in the semiconductor layer sequence. The second trench structure projects into the first semiconductor layer. A side surface of the second trench structure adjoins material of the first semiconductor layer at least in places. A bottom surface of the second trench structure is formed by the first semiconductor layer. In other words, the bottom surface of the second trench structure is arranged at a shorter distance from the substrate than the active region is. In particular, the bottom surface of the second trench structure may be arranged at a shorter distance from the substrate than the bottom surface of the first trench structure is.

According to at least one embodiment of the optoelectronic semiconductor chip, the second trench structure extends, in a plan view of the semiconductor chip, at least in places between the first side surface of the first trench structure and the second side surface of the first trench structure. In particular, the entire second trench structure may be arranged fully inside the first trench structure in a plan view of the semiconductor chip. For example, the second trench structure is separated in the lateral direction both from the first side surface and from the second side surface of the first trench structure in a plan view of the semiconductor chip.

According to at least one embodiment of the optoelectronic semiconductor chip, the semiconductor chip includes a first contact finger structure. The first contact finger structure is provided for electrical contacting of the first semiconductor layer. The contact finger structure includes for example one contact finger, two contact fingers or more than two contact fingers. For example, the first contact finger structure is connected to a first contact surface for external electrical contacting of the optoelectronic semiconductor chip.

In general, a region of a contact layer which has a relatively small extent at least in a lateral direction compared with a contact surface provided for external electrical contacting, for instance for a bonding wire, is regarded as a contact finger structure.

In at least one embodiment of the optoelectronic semiconductor chip, the optoelectronic semiconductor chip includes a semiconductor layer sequence having a first semiconductor layer, a second semiconductor layer and an active region, which is arranged between the first semiconductor layer and the second semiconductor layer and is provided for generating and/or receiving radiation, a first trench structure being formed in the semiconductor layer sequence. The first trench structure passes through the second semiconductor layer and the active region, and is bounded in the lateral direction by a first side surface and a second side surface of the first trench structure. A second trench structure is formed in the semiconductor layer sequence, the second trench structure projecting into the first semiconductor layer and, in a plan view of the semiconductor chip, extending at least in places between the first side surface of the first trench structure and the second side surface of the first trench structure. The semiconductor chip includes a first contact finger structure, which is electrically conductively connected in the second trench structure to the first semiconductor layer.

The electrical contacting of the first semiconductor layer is thus carried out by means of a contact finger structure which is located inside a first trench structure and a second trench structure. The first trench structure expediently has a greater lateral transverse extent than the second trench structure. The transverse extent of the first contact finger structure is expediently less than the transverse extent of the first trench structure, the first contact finger structure being in particular separated both from the first side surface and from the second side surface of the first trench structure. Electrical contacting of the active region or of the second semiconductor layer by means of the first contact finger structure, and an electrical short circuit resulting therefrom, may thus be avoided straightforwardly and reliably.

According to at least one embodiment of the optoelectronic semiconductor chip, the first contact finger structure adjoins a first and/or a second side surface of the second trench structure at least in places. In particular, the first contact finger structure directly adjoins the first semiconductor layer on the first and/or second side surface of the second trench structure. The electrical contacting of the first semiconductor layer may therefore be carried out not only via a bottom surface of the second trench structure, but also via one or more side surfaces of the trench structure. A contacting interface between the first contact finger structure and the first semiconductor layer thus extends not within a plane but along at least two surfaces which are oblique or perpendicular to one another. To this extent, the contacting interface is formed "three-dimensionally". With the same lateral extent of the first contact finger structure, overall the surface on which the first contact finger structure adjoins the first semiconductor layer is thereby increased. Correspondingly, an equally large contacting interface between the first contact finger structure and the first semiconductor layer may also be achieved with a smaller lateral extent of the first contact finger structure. Absorption losses may thus be further reduced.

According to at least one embodiment of the optoelectronic semiconductor chip, the first contact finger structure includes a first connection layer and a first current distribution layer. The first connection layer is, for example, arranged at least in places between the first current distribution layer and the first semiconductor layer in the vertical direction. For example, the first connection layer directly adjoins the first semiconductor layer. The first connection layer is, in particular, provided as a mirror layer for the radiation to be generated and/or to be received in the active region. For example, the first connection layer has a reflectivity of at least 80% for the radiation. For example, the first connection layer includes silver. Silver is distinguished by a particularly high reflectivity in the ultraviolet invisible spectral range. At a wavelength of 450 nm, the reflectivity may for example be 97%. As an alternative or in addition, the first connection layer may for example include aluminum or rhodium, or consist of such a material.

The material for the first current distribution layer may on the other hand, be selected substantially independently of its reflectivity. For example, the first current distribution layer includes gold, nickel, copper, silver or aluminum.

According to at least one embodiment of the optoelectronic semiconductor chip, the first connection layer protrudes beyond the first current distribution layer in the lateral direction at least in places. In particular, the current distribution layer may fully cover the first connection layer in a plan view of the semiconductor chip. By means of the current distribution layer, the first connection layer may be encapsulated on the side facing away from the first semiconductor layer. A material for which the risk of migration exists, for example in the event of moisture, for instance silver, is therefore also suitable for the first connection layer. Aluminum, for which the risk of electromigration exists, may also be used reliably in this configuration.

According to at least one embodiment of the optoelectronic semiconductor chip, the first trench structure is filled with a first insulation layer at least in places.

In the scope of the present application, ordinal numbers are used in connection with terms such as, for example, "first insulation layer" or "second insulation layer", merely for clearer distinction and to simplify the description. The use of the term "second insulation layer" or "third insulation layer" does not, however, necessarily imply the existence of a "first insulation layer".

For example, the first insulation layer fills the entire subregion of the first trench structure laterally with respect to the first contact finger structure.

Furthermore, the first insulation layer may cover a surface of the second semiconductor layer in places. In other words, the first insulation layer may have a greater lateral transverse extent than the first trench structure.

According to at least one embodiment of the optoelectronic semiconductor chip, the first insulation layer includes a multiplicity of sublayers. For example, the sublayers form a dielectric mirror. For example, the first insulation layer includes an alternating sequence of first sublayers and second sublayers, the first sublayers respectively having a lower refractive index than the second sublayers, or vice versa. Absorption losses may be further reduced.

According to at least one embodiment of the optoelectronic semiconductor chip, the semiconductor chip includes a second contact finger structure, which is electrically conductively connected to the second semiconductor layer.

According to at least one embodiment of the optoelectronic semiconductor chip, the second contact finger structure is arranged in the first trench structure in a plan view of the semiconductor chip. In particular, the second contact finger structure may overlap with the first contact finger structure in places. In a plan view of the semiconductor chip, the second contact finger structure is therefore arranged in a region in which the active region is in any case removed or at least deactivated.

The second contact finger structure may, however, also include one or more contact fingers which do not overlap with the first trench structure. Furthermore, the second contact finger structure may also be formed entirely free of overlap with the first contact finger structure.

Regions in which the first contact finger structure and the second contact finger structure overlap may be used both for the lateral current distribution for the contacting of the first semiconductor layer and for the lateral current distribution for the contacting of the second semiconductor layer. For example, at least 10%, at least 30% or at least 90% of the second contact finger structure is located inside the first contact finger structure in a plan view of the semiconductor chip. The greater this percentage is, the more surface of the semiconductor chip, which in any case cannot be used for the radiation generation because of the first contact finger structure, may additionally be used for the charge carrier distribution over the second contact finger structure. Compared with a semiconductor chip in which the first contact finger structure and the second contact finger structure are arranged next to one another free of overlap, the surface of the active region which is covered by the contact finger structures may be reduced.

According to at least one embodiment of the optoelectronic semiconductor chip, a second insulation layer is arranged between the first contact finger structure and the second contact finger structure in the vertical direction. The second insulation layer is used for electrical insulation between the first contact finger structure and the second contact finger structure. For example, the second contact finger structure is electrically conductively connected via a second connection layer and via a second current distribution layer to the second semiconductor layer. For example, the second insulation layer is arranged in places between the second connection layer and the second current distribution layer in the vertical direction, and includes at least one opening in which the second connection layer and the second current distribution layer adjoin one another. In a plan view of the semiconductor chip, the opening is expediently arranged free of overlap with the first trench structure. By means of the position, size and density of the openings, it is possible to adjust the places at which charge carrier injection into the second semiconductor layer takes place to an increased extent. In particular, it is possible to achieve charge carrier injection separated laterally from the second contact finger structure.

A semiconductor chip in which first and second contact finger structures overlap in places, and in which the electrical current introduction is achieved laterally with respect to a contact finger structure via openings in an insulation layer, is described in German Patent Application DE 10 2016 112 587.3, the entire disclosure content of which in this regard is explicitly incorporated into the present application by reference.

The second insulation layer covers for example at least 30%, at least 50%, at least 70% or at least 90% of the entire base surface of the semiconductor chip in a plan view. For example, the insulation layer covers at most 99% of the entire base surface of the semiconductor chip in a plan view.

For the insulation layers, in particular a dielectric material is suitable. A dielectric material is an electrically weakly conductive or nonconductive, nonmetallic material, the charge carriers of which are in general, i.e. for example at the usual operating currents, not freely mobile. The insulation layer contains, for example, at least one of the following materials: silicon nitride, silicon dioxide, silicon oxynitride, aluminum oxide, titanium oxide, tantalum oxide, niobium oxide.

According to at least one embodiment of the optoelectronic semiconductor chip, the first side surface and the second side surface of the first trench structure are formed by a common trench. Between the first side surface and the second side surface, there is thus precisely one trench, in which the entire active region is removed.

According to at least one embodiment of the optoelectronic semiconductor chip, the first side surface of the first trench structure is formed by one trench of the first trench structure and the second side surface is formed by a further trench of the first trench structure. The second trench structure extends between the trench and the further trench in a plan view of the semiconductor chip. In other words, there is respectively a trench of the first trench structure on both sides of the second trench structure.

According to at least one embodiment of the optoelectronic semiconductor chip, a subregion of the active region extends between the first trench and the second trench, the subregion not being electrically contacted by the second semiconductor layer. Thus, although the active region is present in the subregion, it is not adapted for the radiation generation or radiation detection since the second semiconductor layer is not electrically contacted in this subregion, and consequently no charge carriers can enter the active region or be discharged from the active region.

According to at least one embodiment of the optoelectronic semiconductor chip, the first contact finger structure directly adjoins the subregion of the active region in places. In this configuration, the second trench structure may, in particular, extend through the second semiconductor layer and the active region into the first semiconductor layer. The first contact finger structure may thus electrically short-circuit the subregion of the active region. This, however, does not impair the functionality of the optoelectronic semiconductor chip since the subregion of the active region is electrically separated from the remaining part of the active region.

A method for producing an optoelectronic semiconductor chip is furthermore provided. A semiconductor layer sequence having a first semiconductor layer, a second semiconductor layer and an active region, which is arranged between the first semiconductor layer and the second semiconductor layer and is provided for generating and/or receiving radiation, is provided. A first trench structure is formed in the semiconductor layer sequence by means of a first mask layer, the first trench structure passing through the second semiconductor layer and the active region and being bounded in the lateral direction by a first side surface and a second side surface. A second trench structure is formed in the semiconductor layer sequence by means of a second mask layer, the second trench structure projecting into the first semiconductor layer. A first contact finger structure is formed, the first contact finger structure being electrically conductively connected in the second trench structure to the first semiconductor layer. The second trench structure extends between the first side surface of the first trench structure and the second side surface of the first trench structure at least in places in a plan view of the semiconductor layer sequence. The method may, but need not necessarily, be carried out in the specified order of the method steps. For example, the second trench structure may also be formed after the formation of the first trench structure.

During the formation of the first trench structure, it is in particular also possible to form mesa trenches, i.e. trenches which laterally bound the active region of the semiconductor chip along an outer border of the semiconductor chip.

According to at least one embodiment of the method, the first contact finger structure is applied structured by means of the second mask layer. In particular, the second mask layer may be covered with material of the first contact finger structure before the second mask layer is removed. For the formation of the first contact finger structure, it is thus possible to use the same mask as for the formation of the second trench structure. The lateral positioning of the first contact finger structure relative to the second trench structure may thus be carried out in a self-aligned fashion.

According to at least one embodiment of the method, a first insulation layer, which fills the first trench structure in places, is applied before the application of the second mask layer. Topology differences due to the first trench structure may be reduced by means of the first insulation layer. Subsequent layers may thus be applied with an increased reliability.

The production of the optoelectronic semiconductor component is expediently carried out in a panel for the production of a multiplicity of semiconductor components of the same type, the individual optoelectronic semiconductor components being obtained from the panel by an individualization method.

The described method is particularly suitable for the production of an optoelectronic semiconductor chip as described further above. Features mentioned in connection with the method may therefore also be used for the semiconductor chip, and vice versa.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

DETAILED DESCRIPTION

Figure 1A:
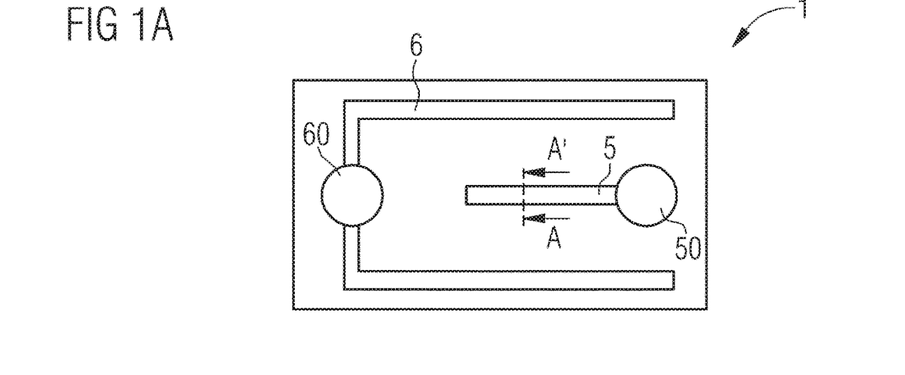
FIGS. 1A, 1B and 1C show an exemplary embodiment of an optoelectronic semiconductor chip in a plan view (FIG. 1A), in a sectional view along the line A-A' shown in FIG. 1A for a subregion of the optoelectronic semiconductor chip (FIG. 1B) and in a plan view belonging to the detail of FIG. 1B in FIG. 1C.
Figure 1B:
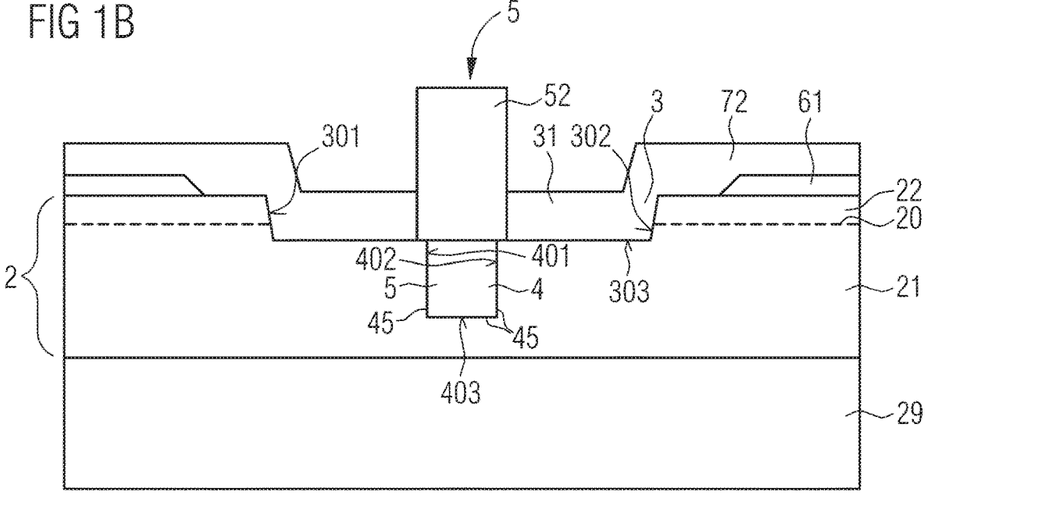
Figure 1C:
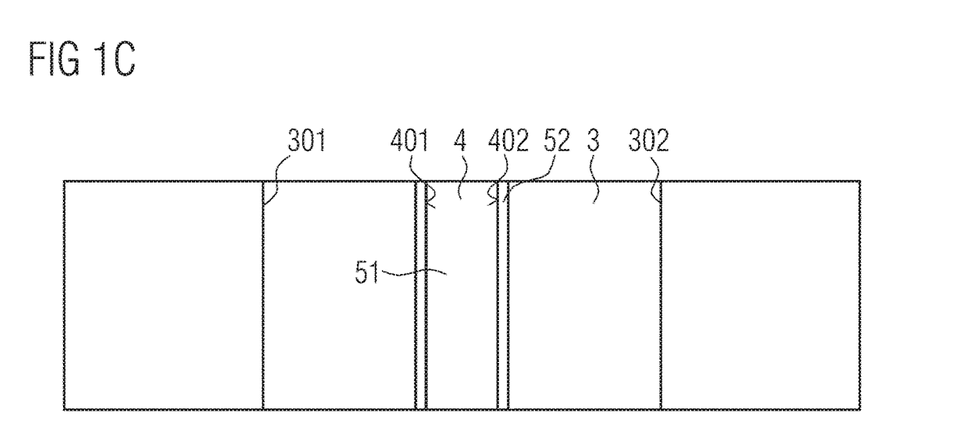

An exemplary embodiment of an optoelectronic semiconductor chip 1 is shown in FIGS. 1A to 1C. The optoelectronic semiconductor chip includes a semiconductor layer sequence 2 having an active region 20, the active region 20 being arranged between a first semiconductor layer 21 of a first conduction type, for example n-conductive, and a second semiconductor layer 22 of a second conduction type different to the first conduction type, for example p-conductive. For example, the active region is provided for the generation of radiation in the ultraviolet, visible or red spectral range. By applying an external electrical voltage between a first contact surface 50 and a second contact surface 60 of the optoelectronic semiconductor chip, charge carriers can be injected through the first semiconductor layer 21 or the second semiconductor layer 22, respectively, into the active region 20 and can recombine there with the emission of radiation.

The following description may, however, also be applied similarly for an optoelectronic semiconductor chip in which the active region 20 is provided for receiving radiation. In this case, charge carrier pairs generated by radiation absorption in the active region are spatially separated from one another so that an external electrical signal can be tapped at the contact surfaces.

The semiconductor layer sequence 2 is arranged on a substrate 29, for instance a growth substrate for epitaxial deposition of the semiconductor layer sequence, for example by means of MOCVD. In particular, sapphire is suitable as the substrate 29 for a semiconductor layer sequence 2 based on nitride compound semiconductor material. As an alternative, for example, silicon carbide, gallium nitride or silicon may be used.

The electrical contacting of the optoelectronic semiconductor chip 1 is carried out from the side of the semiconductor layer sequence 2 facing away from the substrate 29.

A first trench structure 3 is formed in the semiconductor layer sequence 2. In the lateral direction, the first trench structure 3 extends between a first side surface 301 and a second side surface 302. Between the first side surface 301 and the second side surface 302, the active region 20 and the second semiconductor layer 22 are removed.

The first trench structure 3 is formed by a trench 31, the trench forming the first side surface 301 and the second side surface 302 of the trench structure 3.

A second trench structure 4 is formed in the semiconductor layer sequence 2, the second trench structure projecting into the first semiconductor layer 21 and, in a plan view of the semiconductor chip, extending at least in places between the first side surface 301 of the first trench structure and the second side surface 302 of the first trench structure. A bottom surface 303 of the first trench structure is arranged closer to the substrate than the active region 20 is.

The semiconductor chip 1 includes a first contact finger structure 5, which is electrically conductively connected in the second trench structure 4 to the first semiconductor layer 21.

Furthermore, the optoelectronic semiconductor chip includes a second contact finger structure 6, which is electrically conductively connected to the second semiconductor layer 22. The first contact finger structure 5 and the second contact finger structure 6 are electrically conductively connected to the first contact surface 50 and the second contact surface 60, respectively. In particular, the contact finger structures and the assigned contact surfaces may respectively be formed from a common layer or layer sequence. By way of example, the first contact finger structure and the second contact finger structure are respectively formed from metal.

In the exemplary embodiment shown, the first contact finger structure 5 and the second contact finger structure 6 are arranged next to one another free of overlap in a plan view of the semiconductor chip 1. The first contact finger structure 5 and/or the second contact finger structure 6 may respectively include one contact finger, two contact fingers or more than two contact fingers, in which case the number of contact fingers of the first contact finger structure and the number of contact fingers of the second contact finger structure may be equal or different to one another.

In the second trench structure 4, the first contact finger structure 5 adjoins a first side surface 401 and a second side surface 402 of the second trench structure. The electrical contacting of the first semiconductor layer is thus carried out not only by a bottom surface 403 of the second trench structure 4, but also by its side surfaces. In this way, even in the case of a relatively small lateral extent of the first contact finger structure 5, a relatively large contacting interface 45 can be achieved between the first contact finger structure 5 and the first semiconductor layer 21. The first contact finger structure 5 thus forms a three-dimensional contact with the first semiconductor layer 21.

For example, in the case of a lateral extent of the second trench structure of 5 µm in combination with a vertical extent of 2 µm, overall a contacting interface 45 with the first semiconductor layer 21 along 9 µm is achieved in a sectional view. In the case of conventional "two-dimensional" contacting, on the other hand, a lateral extent of 9 µm would be required in order to achieve the same contacting interface. In this example, the lateral extent of the first contact finger structure 5 may thus be almost halved while maintaining the contacting interface and resulting contact resistance at the interface between metal and semiconductor, so that absorption losses can be reduced and the brightness can be significantly increased.

Furthermore, by a reduced lateral extent of the first contact finger structure 5, the surface of the active region 20 usable for the radiation generation may also be increased, since less surface of the semiconductor chip is required for forming the first contact finger structure. In this way, the brightness of the semiconductor type is increased further.

In the vertical direction, an extent of the second trench structure is for example between 0.1 µm inclusive and 9 µm inclusive, for example between 0.5 µm inclusive and 4 µm inclusive, for instance between 0.7 µm inclusive and 2 µm.

The vertical extent of the first trench structure 3 is, in particular, at least so large that the first trench structure 3 passes through the second semiconductor layer 22 and the active region 20 and the first semiconductor layer 21 is exposed in places in the first trench structure. For example, a vertical extent of the first trench structure 3 is between 0.1 µm inclusive and 5 µm, for example between 0.2 µm inclusive and 2 µm inclusive, for instance between 0.3 µm inclusive and 0.7 µm inclusive.

The first contact finger structure 5 may be formed in one layer or a plurality of layers. In the exemplary embodiment shown, the first contact finger structure includes a first connection layer 51 and a current distribution layer 52. The first connection layer 51 directly adjoins the first semiconductor layer 21 in places. The first connection layer 51 may fill the second trench structure 4 fully or only partially in the vertical direction.

The first connection layer 51 is, in particular, formed as a mirror layer for the radiation to be generated in the active region. In particular, silver is suitable for the first connection layer because of a high reflectivity in the visible and ultraviolet spectral ranges. Furthermore, silver is distinguished by a low contact resistance with respect to n-conductive nitride compound semiconductor material, for example gallium nitride.

The first current distribution layer 52 covers the first connection layer 51 fully in a plan view of the semiconductor chip. In particular, the first current distribution layer 52 may protrude beyond the first connection layer 51 in the lateral direction. The current distribution layer 52 may thus fulfill the function of an encapsulation layer for the first connection layer 51. A material for which the risk of migration would exist in the event of insufficient encapsulation, for example in relation to moisture, is therefore also suitable for the first connection layer. This relates, for example, to silver.

The first contact finger structure 5 is separated from the first side surface 301 of the first trench structure and from the second side surface 302 of the first trench structure in the lateral direction. The risk of an electrical short circuit on the side surfaces of the first trench structure 3 may thus be avoided. A second insulation layer 72 is arranged in the first trench structure 3. The second insulation layer 72 may also be the only insulation layer in the semiconductor chip 1. The second insulation layer 72 is used, in particular, for protecting and/or passivating the active region 20, which without the second insulation layer 72 would be exposed on the first side surface 301 and the second side surface 302 of the first trench structure 3.

A second connection layer 61 is arranged on the second semiconductor layer 22. The second connection layer 61 is electrically conductively connected via the second contact finger structure 6 to the second contact surface 60, and is used for laterally uniform introduction of charge carriers into the second semiconductor layer 22. For example, the second connection layer 61 includes a transparent conductive oxide (TCO) material, for instance indium tin oxide (ITO) or zinc oxide (ZnO).

The second trench structure 4 has, for example, a lateral transverse extent of between 0.5 µm inclusive and 20 µm inclusive. The lateral transverse extent of the first trench structure 3 along the same direction is, for example, greater by means of at least 5 µm or by means of at least 10 µm and/or by means of at most 30 µm than the lateral transverse extent of the second trench structure 4.

Figure 2:
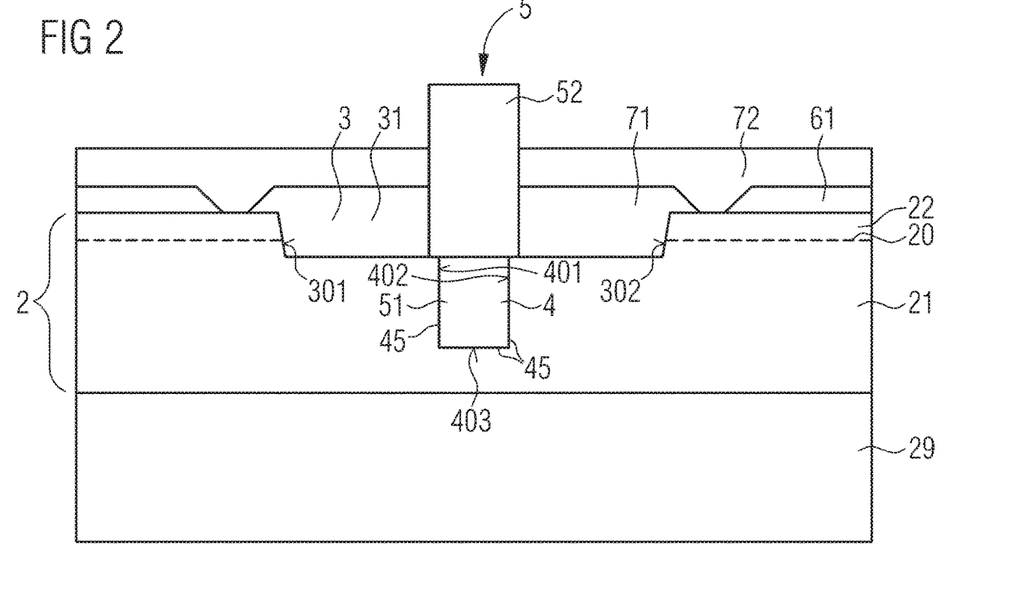
FIGS. 2 and 3 respectively show an exemplary embodiment of an optoelectronic semiconductor chip in a schematic sectional view.

A further exemplary embodiment of an optoelectronic semiconductor chip is shown in FIG. 2. This exemplary embodiment corresponds substantially to the exemplary embodiment described in connection with FIG. 1.

In contrast thereto, a first insulation layer 71 is arranged in the first trench structure 3. The first insulation layer 71 adjoins the first side surface 301 and the second side surface 302 of the first trench structure. In particular, the first insulation layer may fill all of the first trench structure 3 which is not already filled by the first contact finger structure 5 or another solid material. By means of such a first insulation layer, the deposition of subsequent layers may be simplified since the edges thus formed are easier to cover over.

In particular, the first insulation layer 71 may also cover the second semiconductor layer 22 in regions. Reliable electrical insulation of the active region 20 on the first side surfaces 301 and second side surfaces 302 of the first trench structure 3 may thus be achieved in a simplified way. Such an insulation layer and a method for producing such an insulation layer are described in German Patent Application DE 10 2016 105 056.3, the entire disclosure content of which in this regard is hereby explicitly incorporated into the present application here by reference.

The first insulation layer 71 may furthermore also cover a part of the first contact finger structure 5, for instance the first connection layer 51 in places.

Figure 3:
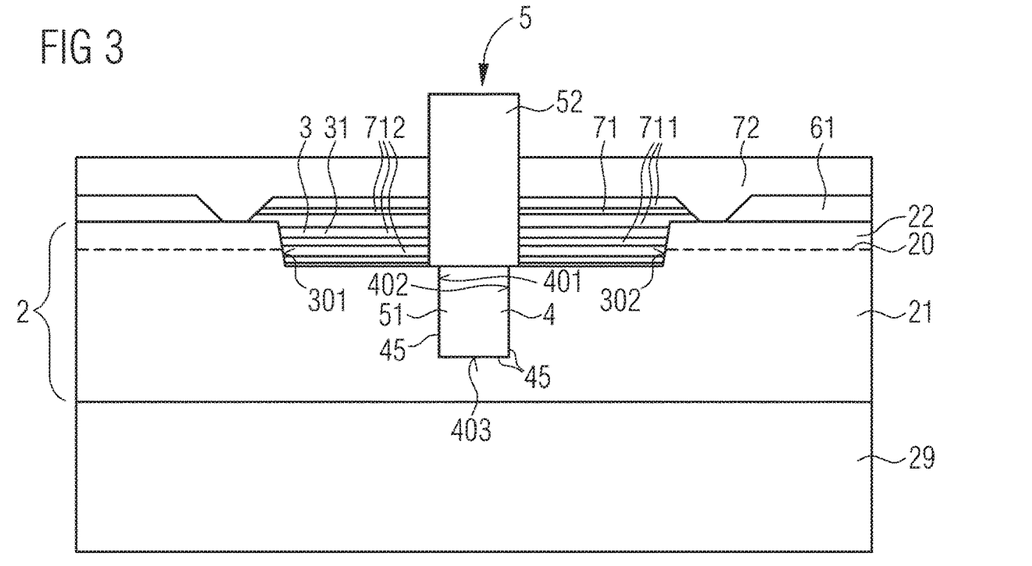

The first insulation layer 71 may be formed in one layer or, as shown in connection with FIG. 3, may be formed in a plurality of layers. For example, the first insulation layer 71 includes a multiplicity of first sublayers 711 and a multiplicity of second sublayers 712, these sublayers being arranged alternately and respectively differing from one another in respect of their refractive index. With such a configuration, a dielectric mirror may be formed. Absorption losses at the first contact finger structure 5, in particular on the first current distribution layer 52 of the first contact finger structure 5, may thus be reduced.

Figure 4A:
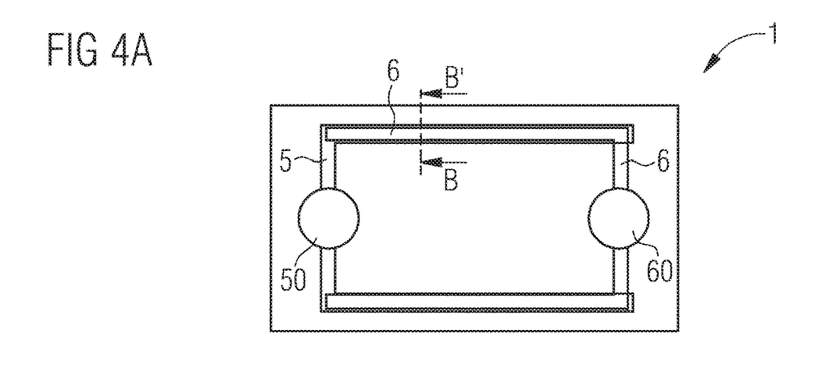
FIGS. 4A and 4B show an exemplary embodiment of an optoelectronic semiconductor chip in a schematic plan view (FIG. 4A) and in a schematic sectional view, along the line B-B' shown in FIG. 4A, of a detail of the optoelectronic semiconductor chip (FIG. 4B)
Figure 4B:
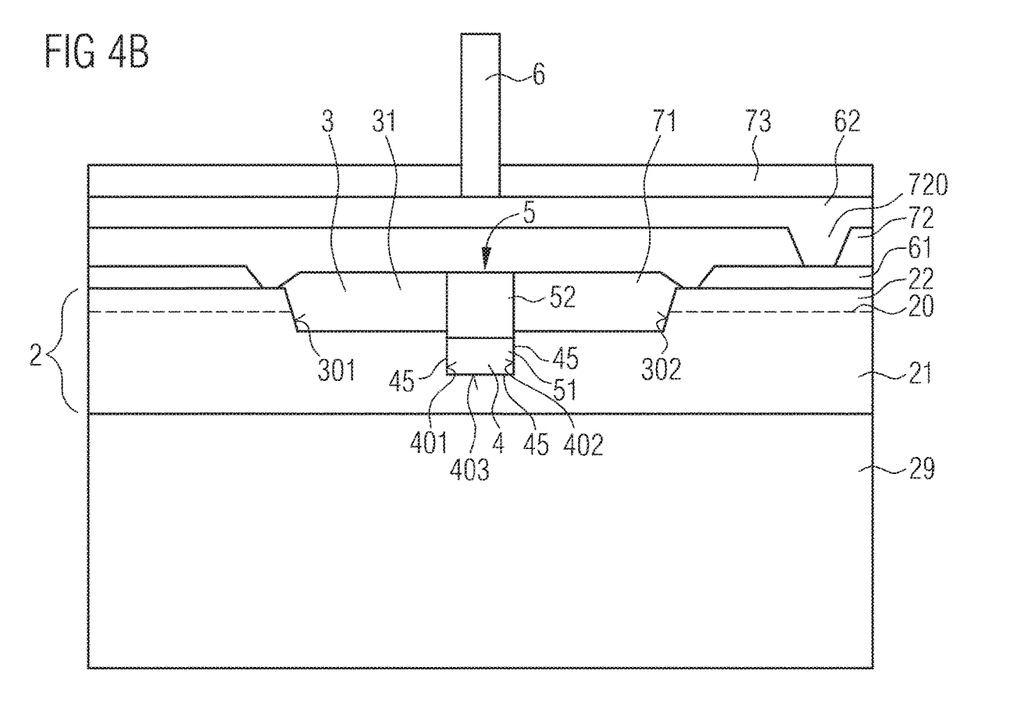

A further exemplary embodiment of a radiation-emitting semiconductor chip is shown in FIGS. 4A and 4B. This exemplary embodiment corresponds substantially to the exemplary embodiments described in connection with FIGS. 1A to 1C.

In contrast thereto, the first contact finger structure 5 and the second contact finger structure 6 overlap in places. In this way, regions of the optoelectronic semiconductor chip may be used both for the current distribution of the charge carrier injection of electrons and the charge carrier injection of holes.

FIG. 4B shows a section along the line B-B', i.e. in a region in which the first contact finger structure 5 and the second contact finger structure 6 overlap. The configuration of the contact finger structures may, however, be varied within wide limits. For example, one of the contact finger structures may also include more or fewer contact fingers than the other contact finger structure. In particular, the second contact finger structure may include at least one contact finger more than the first contact finger structure.

As shown in FIG. 4B, the first contact finger structure 5 and the second contact finger structure 6 are electrically insulated from one another in the vertical direction by means of a second insulation layer 72. The second contact finger structure 6 is connected via a second current distribution layer 62 and a second connection layer 61 electrically conductively to the second semiconductor layer 22.

The lateral extent of the contact fingers of the second contact finger structure 6 may be greater than, less than or equal to the lateral extent of the contact fingers of the first contact finger structure 5.

The second connection layer 61 and the current distribution layer 62 may for example each include a TCO material, for instance ITO or ZnO.

The second insulation layer 72 extends in places between the second connection layer 61 and the second current distribution layer 62. The second insulation layer 72 includes one or a multiplicity of openings 720, in which the second connection layer 61 adjoins the second current distribution layer 62. By means of the position, size and density of the openings 720, it is possible to adjust the charge carrier injection into the second semiconductor layer 22 in respect of its lateral distribution.

In particular, the charge carrier injection into the second semiconductor layer 22 may be carried out at a lateral distance from the first trench structure 3. Absorption losses at the first contact finger structure 5 and/or the second contact finger structure 6 may thus be further reduced.

A third insulation layer 73 is furthermore optionally arranged on the side of the second connection layer 61 facing away from the semiconductor layer sequence 2.

In this exemplary embodiment as well, the first insulation layer 71 may of course form a dielectric mirror as described in connection with FIG. 3.

Figure 5:
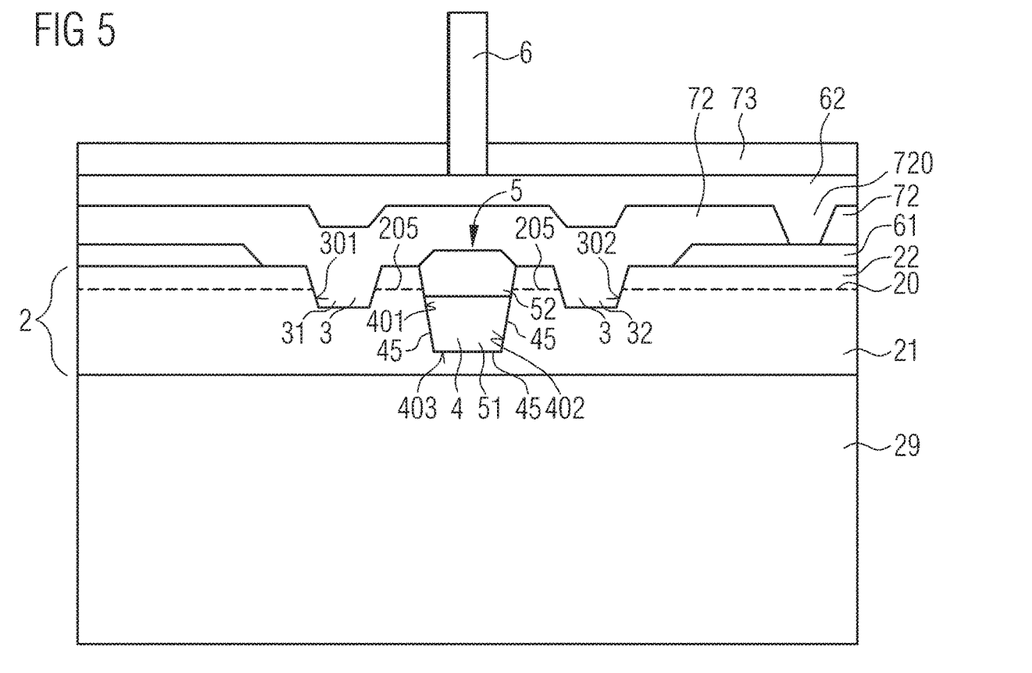
FIGS. 5 and 6 respectively show an exemplary embodiment of an optoelectronic semiconductor chip.

The exemplary embodiment represented in FIG. 5 corresponds substantially to the exemplary embodiment described in connection with FIG. 4. In contrast thereto, the first trench structure 3 includes a further trench 32 in addition to a trench 31. The trench 31 forms the first side surface 301 of the first trench structure 3, and the further trench 32 forms the second side surface 302 of the first trench structure 3. The second trench structure 4 is formed between the trench and the further trench. The active region 20 is thus not fully removed between the first side surface 301 and the second side surface 302. A subregion 205 of the active region is formed, this subregion being electrically insulated from the rest of the active region by means of the trench 31 and the further trench 32. The second semiconductor layer 22 over the subregion is not electrically contacted and, in particular, is not electrically conductively connected to the second connection layer 61.

The second trench structure 4 extends through the second semiconductor layer 22 and the active region 20 into the first semiconductor layer 21. In the second trench structure 4, the first contact finger structure 5 adjoins the first semiconductor layer 21, the active region 20 and the second semiconductor layer 22. The subregion 205 of the active region is thus electrically short-circuited by means of the first contact finger structure 5. Because of the electrical insulation of this subregion from the rest of the active region, however, this does not have a negative effect on the functionality of the optoelectronic semiconductor chip 1.

Figure 6:
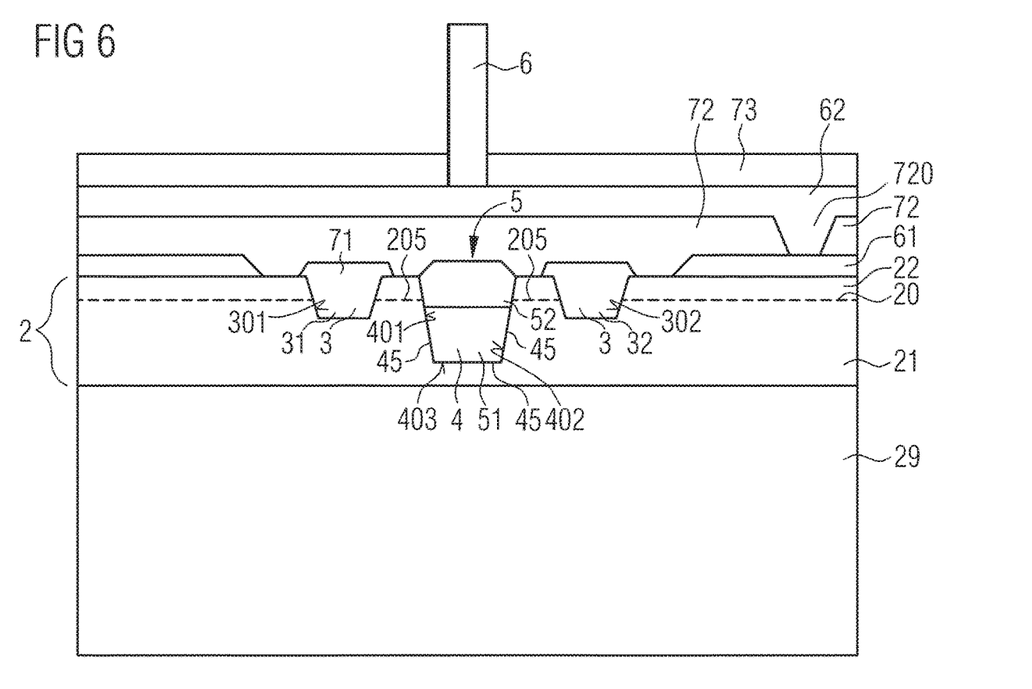

The exemplary embodiment shown in FIG. 6 corresponds substantially to the exemplary embodiment described in connection with FIG. 5. In contrast thereto, the trench 31 and the further trench 32 are filled by means of a first insulation layer 71. Topology differences due to the first trench structure 3 may be compensated for at least partially by means of the first insulation layer 71. In particular, edges which are to be covered over by the second current distribution layer 62 may thus be minimized. Even with a relatively small thickness of the second current distribution layer 62, of about 200 nm or less, reliable continuous electrical contacting between the second contact finger structure 6 and the second semiconductor layer 22 may therefore be achieved in a simplified way. In particular, the risk of reduced transverse conduction owing to a thickness reduction on a covered-over edge is prevented or at least avoided.

In this exemplary embodiment as well, the first insulation layer 71 may be formed as a dielectric mirror, as described in connection with FIG. 3.

An exemplary embodiment of a method for producing an optoelectronic semiconductor chip is shown in FIGS. 7A to 7D with the aid of intermediate steps represented schematically in a sectional view, a semiconductor chip as described in connection with FIGS. 1A to 1C being produced by way of example. The production of the optoelectronic semiconductor chip is carried out in a panel for the simultaneous production of a multiplicity of such optoelectronic semiconductor chips, only a subregion of the panel, from which an optoelectronic semiconductor chip is obtained by individualization, being shown in FIGS. 7A to 7D for the purposes of simplified illustration.

Figure 7A:
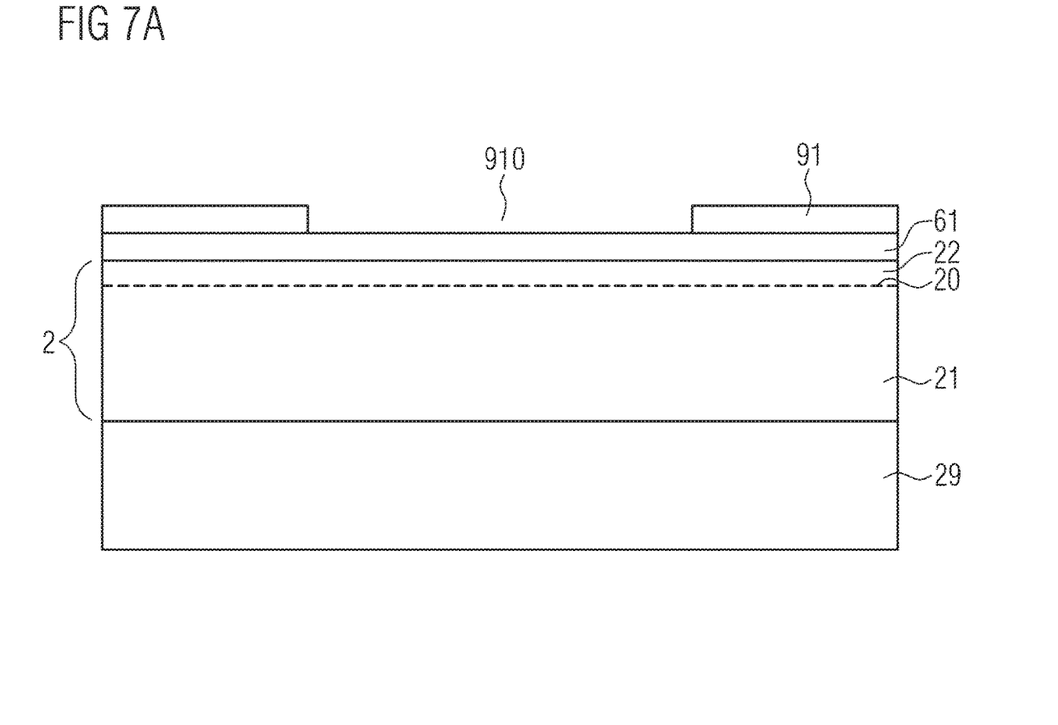
FIGS. 7A to 7D show an exemplary embodiment of a method for producing an optoelectronic semiconductor chip with the aid of intermediate steps schematically represented in a sectional view.

A semiconductor layer sequence 2 having a first semiconductor layer 21, an active region 20 and a second semiconductor layer 22 is provided on a substrate 29. A second connection layer 61, for instance a layer containing a TCO material, is arranged on the second semiconductor layer 22. A first mask layer 91 having a recess 910 is arranged on the semiconductor layer sequence 2. The mask layer 91 is, for example, a photoresist which is photolithographically structured.

Figure 7B:
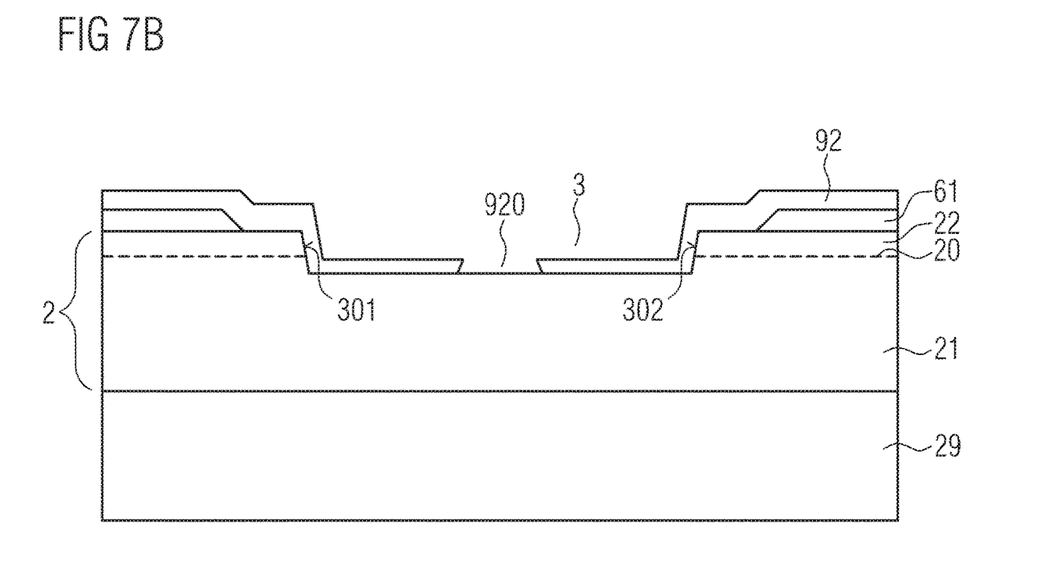

In the region of the recess 910 of the first mask layer 91, a first trench structure 3 is formed which extends through the second semiconductor layer 22 and the active region 20 into the first semiconductor layer 21 (FIG. 7B). The first trench structure 3 may be formed together with the definition of the mesa edge of the semiconductor layer sequence.

In this step, the second connection layer 61 is also ablated. Furthermore, the second connection layer 61 is ablated in the lateral direction, so that the second connection layer 61 is separated from the trench structure 3 in the lateral direction. For example, the distance is about 1 µm. This is carried out in a self-aligned fashion without a further mask.

Subsequently, a second mask layer 92 is applied, the second mask layer 92 being photolithographically structured so that it includes a recess 920. The recess 920 overlaps with the first trench structure 3 and, in particular, lies fully inside the first trench structure in the lateral direction.

Figure 7C:
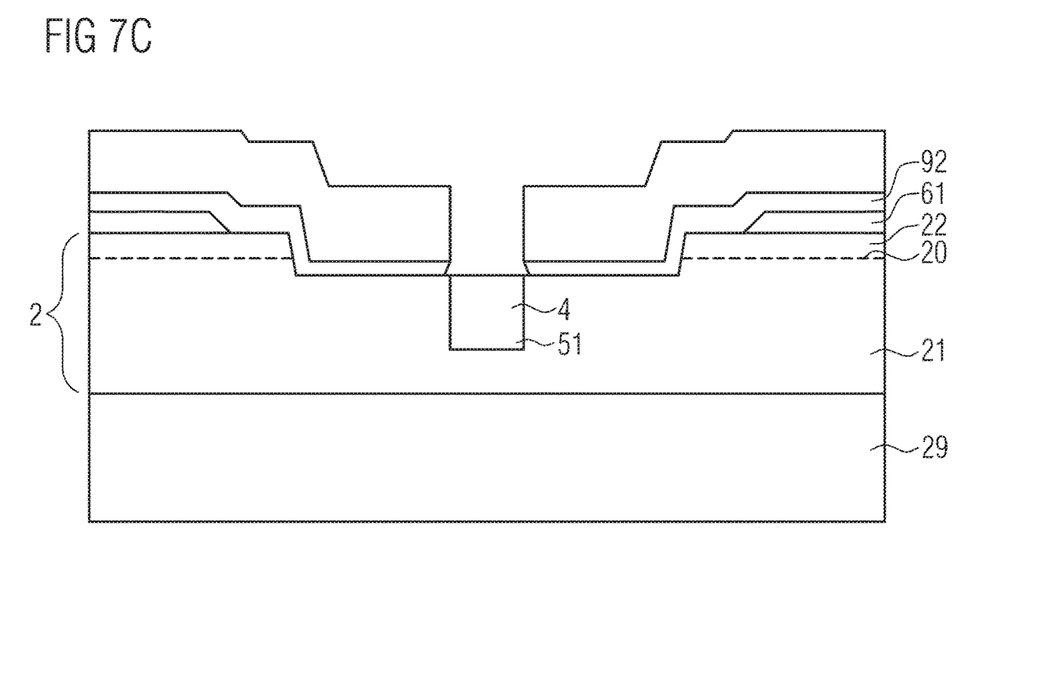

As shown in FIG. 7C, a second trench structure 4 is formed in the region of the recess 920. Subsequently, a part of the first contact finger structure 5, in the exemplary embodiment shown the first connection layer 51 of the first contact finger structure 5, may be applied so that the recess 920 is filled fully, or at least partially. During the application of the first connection layer 51, the second mask layer 92 is still present. By removal of the second mask layer 92, the material of the first connection layer 51 remains only inside the second trench structure 4. A separate mask layer is thus not required for the at least partial filling of the second trench structure 4. The filling of the second trench structure is thus carried out in a self-aligned fashion.

Figure 7D:
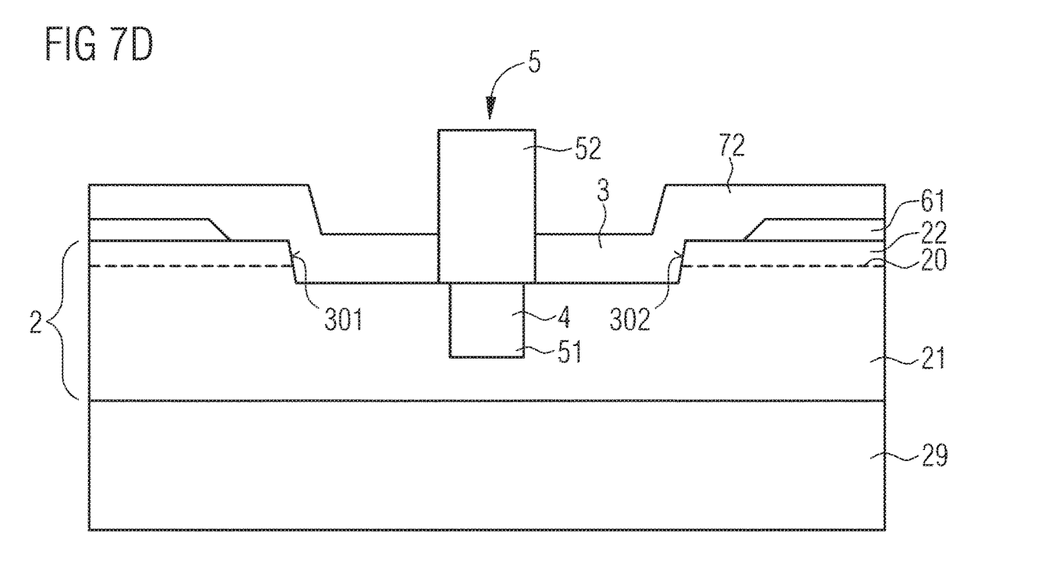

Subsequently, as represented in FIG. 7D, a first current distribution layer 52 may be applied onto the first connection layer. Furthermore, a second insulation layer 72 is applied, which covers the first side surface 301 and the second side surface 302 of the first trench structure 3.

In contrast to the exemplary embodiment described, a first insulation layer, which fills the first trench structure 3 in places, may be applied before the application of the second mask layer 92. In this way, it is possible to produce an optoelectronic semiconductor chip as shown in FIG. 2.

In particular, the first insulation layer 71 may also be applied laterally structured by means of the first mask layer 91. This is described in the aforementioned application DE 10 2016 105 056.3.

The first trench structure 3 need not necessarily be formed before the second trench structure 4. For example, during the production of an optoelectronic semiconductor chip as shown in FIG. 6, it is also possible to form the second trench structure 4 first and then the first trench structure 3.

With the method described, an optoelectronic semiconductor chip which is distinguished by low absorption losses, with at the same time good electrical contactability, may be produced in a straightforward and reliable way.

The invention is not restricted by the description with the aid of the exemplary embodiments. Rather, the invention includes any new feature and any combination of features, which in particular involves any combination of features in the patent claims, even if this feature or this combination is not itself explicitly indicated in the patent claims or exemplary embodiments.

LIST OF REFERENCES 1 semiconductor chip
2 semiconductor layer sequence
20 active region
21 first semiconductor layer
22 second semiconductor layer
205 subregion of the active region
29 substrate
3 first trench structure
301 first side surface of the first trench structure
302 second side surface of the first trench structure
303 bottom surface of the first trench structure
31 trench
32 further trench
4 second trench structure
401 first side surface of the second trench structure
402 second side surface of the second trench structure
403 bottom surface of the second trench structure
45 contacting interface
5 first contact finger structure
50 first contact surface
51 first connection layer
52 first current distribution layer
6 second contact finger structure
60 second contact surface
61 second connection layer
62 second current distribution layer
712 first insulation layer
711 first sublayer
712 second sublayer
91 second insulation layer
720 opening
73 third insulation layer
91 first mask layer
910 recess of the first mask layer
92 second mask layer
920 recess of the second mask layer

The invention claimed is:

1. An optoelectronic semiconductor chip comprising:
a semiconductor layer sequence having a first semiconductor layer, a second semiconductor layer and an active region arranged between the first semiconductor layer and the second semiconductor layer and is provided for generating and/or receiving radiation, wherein:
a first trench structure is formed in the semiconductor layer sequence, the first trench structure passing through the second semiconductor layer and the active region and being bounded in the lateral direction by a first side surface and a second side surface;
a second trench structure is formed in the semiconductor layer sequence; wherein the second trench structure projects into the first semiconductor layer, in a plan view of the semiconductor chip, at a location at least partially between the first side surface of the first trench structure and the second side surface of the first trench structure;
a first contact finger structure electrically conductively connected in the second trench structure to the first semiconductor layer; wherein the first contact finger structure adjoins a first side surface and/or a second side surface of the second trench structure at least in places; and
a second contact finger structure electrically conductively connected to the second semiconductor layer, the second contact finger structure being arranged in the first trench structure in a plan view of the semiconductor chip.

2. The optoelectronic semiconductor chip as claimed in claim 1,
wherein the second contact finger structure overlaps with the first contact finger structure in places.

3. The optoelectronic semiconductor chip as claimed in claim 1, further comprising a second insulation layer arranged between the first contact finger structure and the second contact finger structure in the vertical direction, the second contact finger structure being electrically conductively connected via a second connection layer and a second current distribution layer to the second semiconductor layer.

4. The optoelectronic semiconductor chip as claimed in claim 3,
wherein the second insulation layer is arranged in places between the second connection layer and the second current distribution layer in the vertical direction, and comprises at least one opening in which the second connection layer and the second current distribution layer adjoin one another.

5. The optoelectronic semiconductor chip as claimed in claim 1,
wherein
the first contact finger structure comprises a first connection layer as well as a first current distribution layer,
the first connection layer directly adjoins the first semiconductor layer in places, the current distribution layer fully covers the first connection layer in a plan view of the semiconductor chip, and
the first current distribution layer protrudes beyond the first connection layer in the lateral direction and thus fulfilling the function of an encapsulation layer for the first connection layer.

6. The optoelectronic semiconductor chip as claimed in claim 5,
wherein a transverse extent of the first contact finger structure is less than a transverse extent of the first trench structure.

7. The optoelectronic semiconductor chip as claimed in claim 1,
wherein:
the first contact finger structure adjoins the first side surface and/or the second side surface of the second trench structure at least in places, and
a first insulation layer is arranged in the first trench structure, the first insulation layer adjoining the first side surface and the second side surface of the first trench structure, and filling all of the first trench structure that is not already filled by the first contact finger structure.

8. The optoelectronic semiconductor chip as claimed in claim 7,
wherein the first insulation layer comprises a multiplicity of sublayers configured to form a dielectric mirror.

9. The optoelectronic semiconductor chip as claimed in claim 1,
wherein the first side surface and the second side surface of the first trench structure are formed by a common trench.

10. The optoelectronic semiconductor chip as claimed in claim 1,
wherein the first side surface is formed by one trench of the first trench structure and the second side surface is formed by a further trench of the first trench structure, and wherein the second trench structure extends between the trench and the further trench in a plan view of the semiconductor chip.

11. The optoelectronic semiconductor chip as claimed in claim 10,
wherein a subregion of the active region extends between the first trench and the second trench, the subregion not being electrically contacted by the second semiconductor layer.

12. The optoelectronic semiconductor chip as claimed in claim 11,
wherein the first contact finger structure directly adjoins the subregion of the active region in places.

13. A method for producing an optoelectronic semiconductor chip, wherein the method comprises:
providing a semiconductor layer sequence having a first semiconductor layer, a second semiconductor layer and an active region arranged between the first semiconductor layer and the second semiconductor layer and is provided for generating and/or receiving radiation;
forming a first trench structure in the semiconductor layer sequence by means of a first mask layer, the first trench structure passing through the second semiconductor layer and the active region and being bounded in the lateral direction by a first side surface and a second side surface;
forming a second trench structure in the semiconductor layer sequence by means of a second mask layer, the second trench structure projecting into the first semiconductor layer; wherein the second trench structure projects into the first semiconductor layer at least partially at a location between the first side surface of the first trench structure and the second side surface of the first trench structure in a plan view of the semiconductor layer sequence;
forming a first contact finger structure electrically conductively connected in the second trench structure to the first semiconductor layer, and which adjoins a first side surface and/or a second side surface of the second trench structure at least in places; and
forming a second contact finger structure electrically conductively connected to the second semiconductor layer, the second contact finger structure being arranged in the first trench structure in a plan view of the semiconductor chip.

14. The method as claimed in claim 13,
wherein at least a part of the first contact finger structure is formed by means of the second mask layer.

15. The method as claimed in claim 13, further comprising a first insulation layer that fills the first trench structure in places, is applied before the application of the second mask layer.

16. The method as claimed in claim 13, wherein the second contact finger structure overlaps with the first contact finger structure in places.

17. The method as claimed in claim 13,
wherein:
the first contact finger structure comprises a first connection layer as well as a first current distribution layer,
the first connection layer directly adjoins the first semiconductor layer in places, the current distribution layer fully covers the first connection layer in a plan view of the semiconductor chip, and
the first current distribution layer protrudes beyond the first connection layer in the lateral direction and thus fulfilling the function of an encapsulation layer for the first connection layer.

* * * * *